(12) United States Patent
Basol

(10) Patent No.: US 8,252,621 B2
(45) Date of Patent: Aug. 28, 2012

(54) METHOD FOR FORMING COPPER INDIUM GALLIUM CHALCOGENIDE LAYER WITH OPTIMIZED GALLIUM CONTENT AT ITS SURFACE

(75) Inventor: Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 521 days.

(21) Appl. No.: 12/028,752

(22) Filed: Feb. 8, 2008

(65) Prior Publication Data

US 2009/0199895 A1    Aug. 13, 2009

(51) Int. Cl.
*H01L 21/00* (2006.01)
*H01L 31/00* (2006.01)

(52) U.S. Cl. ........... 438/93; 438/95; 136/261; 136/264; 136/265

(58) Field of Classification Search .......... 136/261, 136/264, 265; 438/93, 95
See application file for complete search history.

(56) References Cited

U.S. PATENT DOCUMENTS

| 4,581,108 | A | 4/1986 | Kapur et al. |
| 4,798,660 | A | 1/1989 | Ermer et al. |
| 6,048,442 | A | 4/2000 | Kushiya et al. |
| 6,092,669 | A | 7/2000 | Kushiya et al. |
| 6,258,620 | B1 | 7/2001 | Morel et al. |
| 6,323,417 | B1 * | 11/2001 | Gillespie et al. ............ 136/262 |
| 6,441,301 | B1 * | 8/2002 | Satoh et al. ................. 136/265 |
| 2006/0207644 | A1 * | 9/2006 | Robinson et al. ............ 136/243 |
| 2007/0163639 | A1 * | 7/2007 | Robinson et al. ............ 136/262 |

OTHER PUBLICATIONS

Klenk et al., "Material properties of CuGaSe2 absorber films prepared by rapid thermal annealing of stacked elemental layers", J.Phys. D: Appl. Phys., vol. 36, 2003, pp. 2531-2537.*
Alberts, et al., "X-Ray Fluorescene Investigatio of the GaDistribution in Cu(In,Ga)Se2 Thin Films", *Solar Energy Mats. and Solar Cells*, vol. 64, 2000, pp. 371.
Basol, B., et al., "Studies on Sulfur Diffusion into Cu(In,Ga)Se2 Thin Films", *Progress in Photovoltaics*, vol. 8, 2000, pp. 227-235.
Basol, B., et al., "Cu(In,Ga)Se2 Thin Films and Solar Cells Prepared by Selenization of Metallic Precursors", *J. Vac. Sci. Technol.*, A.14(4), Jul./Aug. 1996, pp. 2251-2256.
Delsol, et al., "Experimental Study of Graded Bandgap Cu(InGa)(SeS)2 Thin Films Grown on Glass/Molybdenum Substrates by Selemization and Sulphidation", *Solar Energy Mats and Solar Cells*, vol. 82, 2004, pp. 587.
Dhere, et al., "Gallium Content Enhancement in CuIn1-xGaxSe2 Thin Films Prepared by Two-Selenizations Process Using Se Vapor", $25^{th}$ *PVSC*, May 13-17, 1996, Washington CD, pp. 897-900.

(Continued)

*Primary Examiner* — Basia Ridley
*Assistant Examiner* — Thanh-Truc Trinh
(74) *Attorney, Agent, or Firm* — Pillsbury Winthrop Shaw Pittman LLP

(57) ABSTRACT

A method of forming a Group IBIIIAVIA solar cell absorber, which includes a top surface region of less than or equal to 300 nm depth. The Ga/(Ga+In) molar ratio within the top surface region is in the range of 0.1-0.3. The Group IBIIIA-VIA solar cell absorber is formed by reacting the layers of a multilayer material structure which includes a metallic film including at least Cu and In formed on a base, a separator layer including Se is formed on the metallic film, a metallic source layer substantially including Ga formed on the separator layer, and a cap layer substantially including Se formed on the source layer.

26 Claims, 2 Drawing Sheets

OTHER PUBLICATIONS

Gabor, A., et a., "CuInSe2 Thin Film Formation by Rapid Annealing of the elemental Precursor" *AIP Conf. Proc.*, vol. 268, 1992, pp. 236.

Karg, F., et al., "Novel Rapid-Thermal-Processing for CIS Thin Film Solar Cells", *Proc. of IEEE Photovoltaic Specialists Conf.*, 1993, pp. 441-446.

Lundberg, et al., "Diffusion of Indium and Gallium in Cu(In, Ga)Se2 Thin Film Solar Cells", *J. of Physics and Chem of Solids*, vol. 64, 2003, pp. 1499-1504.

Marudachalam, et al., "Phases, Morphology, and Diffusion in CuInxGaI-xSe2 Thin Films", *J. Appl. Phys.*, vol. 82, 1997, pp. 2896.

Mooney, G., et al., "The Formation of CuInSe2 Thin Films by Rapid Thermal Processing", *Solar Cells*, vol. 30, 1991, pp. 69.

Nakagawa, et al., "Development of Cu(In,Ga)Se2 Thin Film Solar Cells by Encapsulated Selenization ", *14th European Photovoltaic Solar Energy Conference*, 1997, pp. 1216-1219.

Palm, et al., "Cu(In,Ga)(Se,S)2 Absorbers Formed by Rapid Thermal Processing of Elemental Precursors", *MRS Proc.*, vol. 763, 2003, pp. 275-280.

Ramanathan, et al., "Properties of 19.2% Efficiency ZnO/CdS/ CuInGaSe2 Thin Film Solar Cells", *Progress in Photovoltaics*, vol. 11, 2003, pp. 225-230.

* cited by examiner

METHOD FOR FORMING COPPER INDIUM GALLIUM CHALCOGENIDE LAYER WITH OPTIMIZED GALLIUM CONTENT AT ITS SURFACE

FIELD OF THE INVENTION

The present invention relates to method and apparatus for preparing thin films of semiconductor films for radiation detector and photovoltaic applications.

BACKGROUND

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors that contain Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or Cu(In,Ga)(S,Se)$_2$ or CuIn$_{1-x}$Ga$_x$(S$_y$Se$_{1-y}$)$_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications. It should be noted that although the chemical formula for CIGS(S) is often written as Cu(In,Ga)(S,Se)$_2$, a more accurate formula for the compound is Cu(In,Ga)(S,Se)$_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, Cu(In,Ga)(S,Se)$_2$ means the whole family of compounds with Ga/(Ga+In) molar ratio varying from 0 to 1, and Se/(Se+S) molar ratio varying from 0 to 1.

The structure of a conventional Group IBIIIAVIA compound photovoltaic cell such as a Cu(In,Ga,Al)(S,Se,Te)$_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of Cu(In,Ga,Al)(S,Se,Te)$_2$, is grown over a conductive layer 13 or contact layer, which is previously deposited on the substrate 11 and which acts as the electrical contact to the device. The substrate 11 and the conductive layer 13 form a base 13A on which the absorber film 12 is formed. Various conductive layers that include Mo, Ta, W, Ti, and their nitrides etc. have been used in the solar cell structure of FIG. 1. If the substrate itself is a properly selected conductive material, it is possible not to use the conductive layer 13, since the substrate 11 may then be used as the ohmic contact to the device. After the absorber film 12 is grown, a transparent layer 14 such as a CdS, ZnO, CdS/ZnO or CdS/ZnO/ITO etc. stack is formed on the absorber film 12. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the Cu(In,Ga,Al)(S,Se,Te)$_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

In a thin film solar cell employing a Group IBIIIAVIA compound absorber, the cell efficiency is a strong function of the molar ratio of IB/IIIA. If there are more than one Group IIIA materials in the composition, the relative amounts or molar ratios of these IIIA elements also affect the properties. For a Cu(In,Ga)(S,Se)$_2$ absorber layer, for example, the efficiency of the device is a function of the molar ratio of Cu/(In+Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In+Ga) molar ratio is kept at around or below 1.0. As the Ga/(Ga+In) molar ratio increases, on the other hand, the optical bandgap of the absorber layer increases and therefore the open circuit voltage of the solar cell increases while the short circuit current typically may decrease. So far experimental results have shown that a Ga/(Ga+In) ratio of about 0.2-0.3 at the junction area (top 0-1 to 0.3 μm of the CIGS surface) yields the highest efficiency solar cells. When this ratio increases further, the device efficiency gets reduced. Although the reasons for this are not fully understood, it is reported that the electronic quality of CIGS material gets worse as the Ga/(Ga+In) ratio increases beyond 0.3. It is important for a thin film deposition process to have the capability of controlling both the molar ratio of IB/IIIA, and the molar ratios of the Group IIIA components in the composition.

One attractive technique for growing Cu(In,Ga)(S,Se)$_2$ type compound thin films for solar cell applications is a two-stage process where metallic components of the Cu(In,Ga)(S,Se)$_2$ material are first deposited onto a substrate during the first stage of the process, and then reacted with S and/or Se in a high temperature annealing process during the second stage. Sputtering and evaporation techniques have been used in prior art approaches to deposit the layers containing the Group IB and Group IIIA components of the precursor stacks during the first stage of such a process. In the case of CuInSe$_2$ growth, for example, Cu and In layers were sequentially sputter-deposited on a substrate and then the stacked film was heated in the presence of gas containing Se at elevated temperature for times typically longer than about 30 minutes, as described in U.S. Pat. No. 4,798,660. More recently U.S. Pat. No. 6,048,442 disclosed a method of sputter-depositing a stacked precursor film that includes a Cu—Ga alloy layer and an In layer to form a Cu—Ga/In stack on a metallic back electrode layer and then reacting this precursor stack film with one of Se and S to form the absorber layer. U.S. Pat. No.

6,092,669 described sputtering-based equipment for producing such absorber layers. According to a method described in U.S. Pat. No. 4,581,108, a Cu layer is first electrodeposited on a substrate; this is then followed by electrodeposition of an In layer and heating of the deposited Cu/In stack in a reactive atmosphere containing Se to form $CuInSe_2$ or CIS.

Heating of metallic precursors to form CIS type layers may be carried out in various ways. Some groups use standard furnace processing to heat the layers slowly (such as at a rate of 1 C/second) to the reaction temperature of 400-500 C in presence of Se and/or S. This furnace type processes generally use a gas as the source of Group VIA material. For example, $H_2Se$ and $H_2S$ are commonly used to react precursors that include Cu and In, to form CIS layers. The reaction time in such a process is usually in the range of 0.5-2 hours. For precursors that also contain a Group VIA material (such as a base/Cu/In/Se stack) a rapid thermal processing (RTP) process with a temperature rise rate of 10 C/second is preferred as the temperature passes through the melting point of Se (about 220 C), because such a high rise rate of temperature around the Se melting point avoids the formation of defects on the surface of the film which may result from de-wetting of the surface by the molten Se if too much time is allowed for Se to melt and form "balls" on the surface due to surface tension. Such defects are known to yield inhomogeneous film morphology, poor adhesion of the CIS layer and low solar cell efficiency. It is stated that such problems may be avoided by passing through the critical temperature range between 80 C and 300 C at a temperature rise rate of about 10 C/sec by using RTP (see for example, F. Karg et al., Proceedings of IEEE Photovoltaic Specialists Conf., 1993, page: 441). High rate RTP has been used by others also to form CIS layers (see for example, A. Gabor et al., AIP Conference Proceedings 268, 1992, page: 236, and G. Mooney et al., Solar Cells, vol: 30, page: 69, 1991). Although various rise rates for temperature were evaluated in these early studies a rate of around 10 C/second was found to be best in terms of morphology of the resulting CIS films. In these early studies Ga was not added to the absorber.

Although CIS formation using two-stage processes employing slow annealing using a gaseous Se source or fast annealing using a Se layer deposited on a Cu/In precursor is rather straight forward, complications arise when Ga is added to the precursor to form a CIGS absorber. Curve A in FIG. 2 schematically shows a typical distribution profile for the Ga/(Ga+In) molar ratio for a $Cu(In,Ga)Se_2$ absorber layer formed by a two-stage process involving selenization of metallic precursors including Cu, In and Ga. As can be seen from this figure, one problem faced with the selenization type processes or two-stage processes to grow CIGS is the difficulty of distributing Ga uniformly through the thickness of the absorber layer formed after reaction of Cu, In and Ga containing metallic precursor film with Se. It is believed that when a metallic precursor film including Cu, In and Ga is deposited first on a contact layer (such as Mo) of a base and then reacted with Se, the Ga-rich phases segregate to the film/base interface (or the film/contact layer interface) because reactions between Ga-bearing species and Se are slower than the reactions between In-bearing species and Se. Therefore, such a process yields compound absorber layers with surfaces that are rich in In and poor in Ga. Various reports in the literature have described this phenomenon (see for example, Basol et al., Progress in Photovoltaics, vol. 8 (2000) p. 227, Alberts et al., Solar Energy Materials and Solar Cells, vol. 64 (2000) p. 371, Marudachalam et al., J. Appl. Phys., vol. 82 (1997) p. 2896, Delsol et al., Solar Energy Materials and Solar Cells, vol. 82 (2004) p. 587). Furthermore, such Ga grading is observed even when a RTP process is used to react precursor layers including Cu, In, Ga and Se (see for example, J. Palm et al., MRS Proceedings vol:763, page B6.8.1, 2003). It is for this reason that, as can be seen in some of the references cited above, increasing the bandgap value of the absorber near its surface region is usually achieved by first obtaining a CIGS layer with a Ga poor surface (such as shown in FIG. 2 Curve A) and then reacting this layer with sulfur (S) at high temperature so that the Ga-poor, In-rich surface layer is converted into a high bandgap sulfide material as shown by the S profile curve B in FIG. 2. In this case the absorber layer is a CIGSS layer containing both S and Se.

When a solar cell is fabricated on an absorber layer with Ga gradation such as the one shown in FIG. 2, the active junction of the device is formed within the absorber surface region with a low Ga/(Ga+In) ratio, which is near-zero for Curve A. This surface portion or region, therefore, is practically a $CuInSe_2$ layer with a small bandgap and consequently solar cells fabricated on such layers display low open circuit voltages (typically in the range of 400-500 mV) and thus lower efficiencies. It should be noted that the bandgap values for $CuInSe_2$ and $CuGaSe_2$ are around 1.0 eV and 1.7 eV, respectively and by adjusting the amount of Ga in CIGS, the bandgap may be tuned to any value between these two values. Relatively uniform Ga distribution through a CIGS layer may be readily obtained by a technique such as co-evaporation. Solar cells fabricated on such absorbers display higher voltage values of typically over 600 mV due to the presence of Ga (typically 20-30%) near the surface region. The world-record-holding CIGS solar cell with over 19% conversion efficiency was demonstrated on such an absorber obtained by a co-evaporation process (see, for example Ramanathan et al., Progress in Photovoltaics, vol. 1 (2003) p. 225). Obtaining Ga distribution profiles with more Ga near the surface region for absorbers formed by low cost two-stage processes is important to increase the performance of such absorbers. Several attempts were made to investigate the possibility of controlling Ga distribution within absorbers grown by the two-stage processes. Marudachalam et al. (J. Appl. Phys., vol. 82 (1997) p. 2896), for example, annealed the already formed CIGS layers at high temperatures to diffuse Ga to the surface from the back side of the absorber. Nakagawa et al. (14$^{th}$ European Photovoltaic Solar Energy Conf., 1997, p. 1216) prepared CIGS layers using various precursor stacks of In—Se/Cu/Ga—Se, In—Se/Ga—Se/Cu, Cu/In—Se/Ga—Se, Cu/Ga—Se/In—Se, Ga—Se/Cu/In—Se, Ga—Se/In—Se/Cu, In—Se/Ga—Se/Cu/Ga—Se, Ga—Se/In—Se/Cu/Ga—Se, and Ga—Se/In—Se/Ga—Se/Cu. As can be seen from this list, the prior art attempts used precursor stacks including compounds or selenides such as gallium selenide (Ga—Se) and indium selenide (In—Se) in attempts to distribute Ga in various ways in the stack. These are phases with high melting temperatures of above 600 C. CIGS formation by two-stage process takes place at temperatures below 600 C, typically at around 450-575 C. Therefore, metallic precursors having low temperature melting phases (such as In and Ga metals and metallic alloys such as In—Ga, Cu—Ga, Cu—In and Cu—In—Ga), with melting points below 600 C, may be preferred since they may facilitate liquid phase assisted growth which yields large grain growth. As the brief discussion above demonstrates there is still a need to develop a two-stage approach that can utilize precursor layers substantially including metallic ingredients and still provide CIGS absorber layers with a Ga/(Ga+In) molar ratio in the range of 0.1-0.3 near its surface region, i.e. within the top 0.1-0.3 um of the absorber layer.

SUMMARY

The present invention provides a method of forming a Group IBIIIAVIA solar cell absorber, which includes a surface region of less than or equal to 300 nm depth. The Ga/(Ga+In) molar ratio within the surface region is in the range of 0.1-0.3. The Group IBIIIAVIA solar cell absorber is formed by reacting the layers of a multilayer material structure which includes a metallic film including at least Cu and In formed on a base, a separator layer including a Group VIA material is formed on the metallic film, a metallic source layer substantially including Ga formed on the separator layer and a cap layer substantially including Se on the source layer. The Group VIA material includes at least one of Se and Te.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION

Present invention uses a specific precursor layer structure and a specific heating means to grow a $Cu(In,Ga)Se_2$ or CIGS absorber layer with a Ga/(Ga+In) ratio of 0.1-0.3 within the top 0.3 um portion of the absorber. This way, when a junction is formed on the top portion of the absorber, highly efficient solar cells with open circuit values exceeding 600 mV can be fabricated without the use of sulfur (S).

Figure 3:
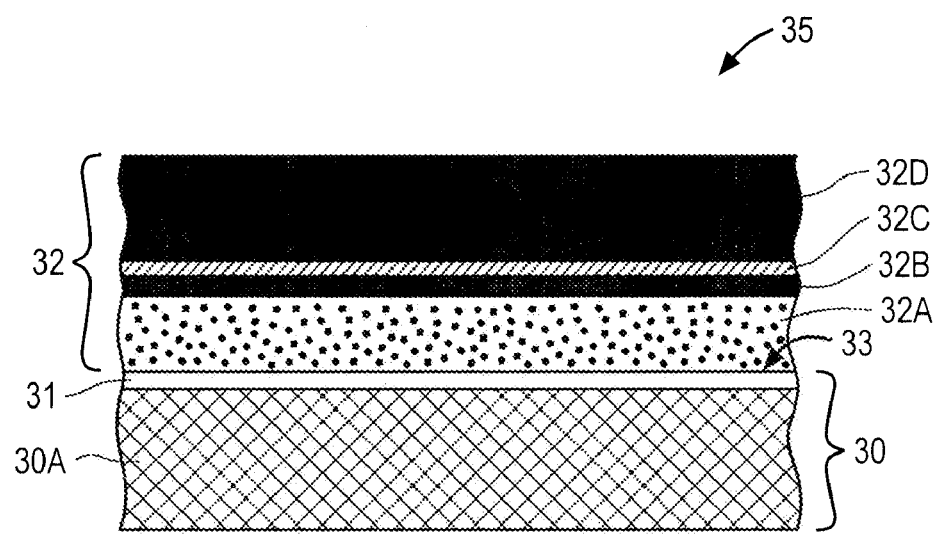
FIG. 3 is a precursor structure according to an embodiment of the present invention.

FIG. 3 schematically shows a structure 35 including a precursor layer 32 formed on a base 30 in accordance with the present invention. The base 30 comprises a substrate 30A and a contact layer 31. The substrate 30A may be an insulating sheet or foil such as glass or polyimide or a conductive sheet or foil such as stainless steel or aluminum alloy web. The contact layer 31 may comprise a conducting material such as Mo, Ta, Ru, Ir and Os among others. The precursor layer 32 is grown on the top surface 33 of the contact layer 31. The precursor layer 32 comprises three portions.

The first portion 32A is next to the contact layer 31 and it comprises a metallic film having metallic Cu, In and optionally Ga. This is the portion of the precursor 32 where most of the In and Cu are supplied from. The ingredients within the first portion 32A are metallic, either elemental or alloy form of Cu, In and optionally Ga so that during the reaction step CIGS film can grow with good microstructure and large grains. Accordingly the first portion 32A may comprise stacks containing Cu, In and Ga (for example Cu/In/Ga, Cu/Ga/In, etc. stacks) or stacks of metallic alloys and elements (such as Cu—In/Cu—Ga, Cu—In/Ga, Cu—Ga/In, Cu—Ga/Cu—In, etc.). The first portion 32A may be deposited by various techniques such as evaporation, sputtering, ink or slurry deposition etc., however, preferred method is electroplating. The thickness of the first portion 32A may be in the range of 400-2000 nm, preferably in the range of 500-1000 nm. The Cu1/(In1+Ga1) molar ratio in the first portion 32A may be in the range of 0.7-1.2, preferably in the range of 0.8-1.0. In this equation Cu1, In1 and Ga1 represent the number of moles of Cu, In and Ga, respectively, within the first portion 32A. The In1/T1 molar ratio may be in the range of 0.25-0.6, where T1 represents the total number of moles of all elements within the first portion 32A, i.e. T1 comprises total number of moles of Cu, In, Ga and an additive material such as a dopant material including one of Na, K, Li and the like that may be present in the first portion 32A. It should be noted that there is no Group VIA material such as Se present in the first portion 32A.

The second portion 32B or separator layer substantially comprises a Group VIA material such as Se and Te with (VIA)2/T2 molar ratio being in the range of 0.95-1.0. In this equation (VIA)2 represents the number of moles of Group VIA materials and T2 represents the total number of moles of all elements within the second portion 32B. In other words, the second portion 32B is substantially made of a Group VIA material such as Se and Te, but it also may include up to about 5% mole of other elements or additive materials such as at least one of Cu, In, Ga, and a dopant material including one of Na, K, Li and the like. Preferably, the second portion comprises only a Group VIA material. The Group VIA material may be Se or Te or a mixture of Se and Te. The thickness of the second portion may be in the range of 50-1500 nm, preferably in the range of 100-1000 nm. Various approaches such as evaporation and ink or slurry deposition may be used to deposit the second portion 32B, but the preferred method is electroplating.

A third portion 32C or source layer is formed on the second portion 32B. The third portion 32C comprises Ga. For example, the third portion may be a film of Ga, or it may additionally contain small amounts of In and/or Cu. In any case the Ga3/T3 molar ratio within the third portion 32C may be in the range of 0.8-1.0, where Ga3 represents the number of moles of Ga and T3 represents the total number of moles of all elements such as Cu and In that may be present within the third portion 32C. The third portion 32C comprises mostly Ga and additive materials such as metallic elements of Cu and In and possibly dopants including one of Na, K, Li and the like. The thickness of the third portion 32C may be in the range of 10-200 μm, preferably in the range of 20-100 nm. The third portion 32C may be deposited using various thin film deposition methods, however, the preferred method is evaporation.

The fourth portion 32D or cap layer of the precursor layer 32 consists substantially of Se. This layer may be deposited using various techniques but the preferred method is evaporation. The thickness of the fourth portion 32D may be in the range of 500-5000 am, preferably in the range of 800-3000 nm. The Se4/T4 molar ratio within the fourth portion 32D may be in the range of 0.95-1.0, where Se4 represents the number of moles of Se and T4 represents the total number of moles of all elements within the fourth portion 32D. In other words T4 includes other elements or additive materials that may be present in the fourth portion 32D such as Te and alkali metal dopant materials including one of Na, K, Li and the like.

Each portion described above has a function within the unique structure of the precursor layer 32 of the present invention. The first portion 32A is the source or provider of most of the Cu and In, and optionally Ga of the overall precursor layer 32. The second portion 32B is a separator between the first portion 32A and the third portion 32C and it provides a Group VIA material such as Se or Te to both the first portion 32A and the Ga-containing third portion 32C when the temperature of the precursor layer 32 is rapidly raised above 400 C. Such reaction of Se and/or Te with the Ga within the third portion 32C helps arrest Ga diffusion towards the contact layer 31 and keeps Ga close to the surface of the absorber after the reaction step. It should be noted that even if Te is included in the second portion 32B, the absorber film obtained after the heating and reaction of the precursor layer 32 would be substantially a CIGS layer since the thickness of the second portion 32B is much smaller than that of the fourth portion 32D which comprises mostly Se. Since Te is a Group VIA material like Se and since the bandgap of $CuInTe_2$ is very similar to the bandgap of $CuInSe_2$, inclusion of some Te in the CIGS layer does not negatively impact the quality of the resulting absorber layer.

As reviewed before, one of the prior art methods to form CIGS absorbers employed a Cu/In/Ga/Se precursor structure and rapid thermal processing to convert this precursor structure into a CIGS absorber. Resulting CIGS absorbers comprised segregated In-rich and Ga-rich sections (as in FIG. 2) even though Ga was placed far away from the contact layer. The reason for this is the fact that when the temperature of such a precursor layer or stack is raised, Ga can react with the Se layer placed on top of it as well as with the In layer and the Cu layer placed under it. Gallium reaction and intermixing with In and Cu is faster than its reaction with Se. Therefore, it in effect moves towards the contact layer while In and Cu move towards the surface. In the present invention Group VIA-rich second portion 32B is placed under the Ga-containing third portion 32C so that this problem can be avoided and the Group VIA-rich second portion 32B acts as a barrier between the In-containing first portion 32A and the Ga-containing third portion 32C. If the metallic Ga of the third portion 32C were to be placed directly on top of the Cu and In containing first portion 32A, without placing the second portion 32B between the two portions, metallic Ga of the third portion 32C would easily mix in with the metallic Cu and In of the first portion 32A and move towards the contact layer 31 as explained above.

The fourth portion 32D provides the excess Se to the overall compound absorber formation process and at the same time, since it is in physical contact with the Ga-containing third portion 32C, it assists in reacting metallic Ga with Se and thus arrest its diffusion from the surface region of the absorber during the reaction. As the above discussion demonstrates, sandwiching the Ga-containing third portion 32C between Se and/or Te containing second portion 32B and Se containing fourth portion 32D helps keep Ga near the surface. Metallic Cu and In containing first portion 32A is relatively thick and it assists in forming a CIGS layer with a good microstructure and with large grains after the reaction. It should be noted that all portions of the precursor layer 32 are formed at relatively low temperatures, typically below 100 C, preferably below 50 C. This way, substantially discrete nature of each of the first portion 31A, the second portion 32B, the third portion 32C and the fourth portion 32D is preserved without much reaction between each portion. The reaction step is then carried out, preferably in a different apparatus, using RTP approach as will be described next. This is different from some prior art methods where various species of Cu, In, Ga and Se are deposited at various stages of the process on a heated substrate causing reaction and compound absorber formation during the film deposition step.

As stated before, it is believed that when a substantially metallic precursor film including metallic Cu, In and Ga is deposited first on a contact layer (such as Mo) of a base and then reacted with Se, the Ga-rich phases segregate to the film/base interface (or the film/contact layer interface) because reactions between Ga-bearing species and Se are slower than the reactions between In-bearing species and Se. Therefore, such a process yields compound absorber layers with surfaces that are rich in In and poor in Ga. There are reports in the literature (see, e.g. Wolf et al., Proceedings of $2^{nd}$ World Conference on PV Solar Energy Conversion, 6-10 Jul., 1998, p. 2426) stating that formation of In—Se and Cu—Se species take place at temperatures above 200 C and formation of $CuInSe_2$ may initiate at around 300-350 C when a metallic precursor layer containing Cu and In is reacted with Se. Formation of $CuGaSe_2$ phase, however, takes place above 450 C, typically at or above 500 C. There are also studies made on inter-diffusion of $CuInSe_2/CuGaSe_2$ bi-layers in absence and presence of an alkali metal such as Na. Results suggest that presence of Na reduces inter-diffusion between the In-rich and Ga-rich phases and promotes segregation of In-rich and Ga-rich phases through the thickness of the absorber layer. This represents a negative result for the prior art methods where segregation of Ga is a problem. On one hand an alkali metal such as Na is needed to lower the resistivity of the resulting compound layers and therefore Na is usually included in the precursor layers including Cu, In and Ga by deposition of a Na compound at the contact layer/ precursor layer interface, but on the other hand, presence of Na encourages the formation of non-uniform Ga distribution shown in FIG. 2. In the present invention, the above mentioned Na effect may be used to ones benefit. In that respect, instead of on the contact layer 31, Na may be included in at least one of the second portion 32B, the third portion 32C and the fourth portion 32D of the precursor layer 32. This can be achieved by depositing a discrete film (not shown) of a Na-containing material (such as Na, Na—Se, Na—S, Na—F, Na—I, etc.) within the stack defined by the second portion 32B, the third portion 32C and the fourth portion 32D.

Alternately a Na-containing material may be co-deposited along with at least one of the second portion 32B, the third portion 32C and the fourth portion 32D. In any case, the equivalent thickness of this Na-containing film may be in the range of 2-40 nm, preferably in the range of 5-20 nm. By including Na in at least one of the Ga and Se-rich portions, i.e. second, third and fourth portions, of the overall precursor layer 32, diffusion of the Ga species (which react with Se) down towards the contact layer 31 is reduced because of presence of Na within these Ga and Se-rich portions, and because of the above mentioned nature of Na retarding inter-diffusion of Ga-rich and In-rich phases. It should be noted that inclusion of Na in the first portion 32A is optional in this case. It should also be noted that although Na is the preferred doping material, it may be wholly or partially replaced by another alkali metal such as K and Li.

Figure 1:
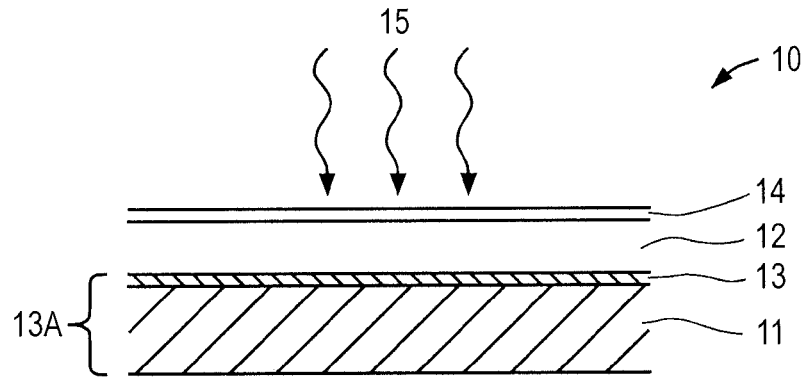
FIG. 1 is a cross-sectional view of a solar cell employing a Group IBIIIAVIA absorber layer.
Figure 2:
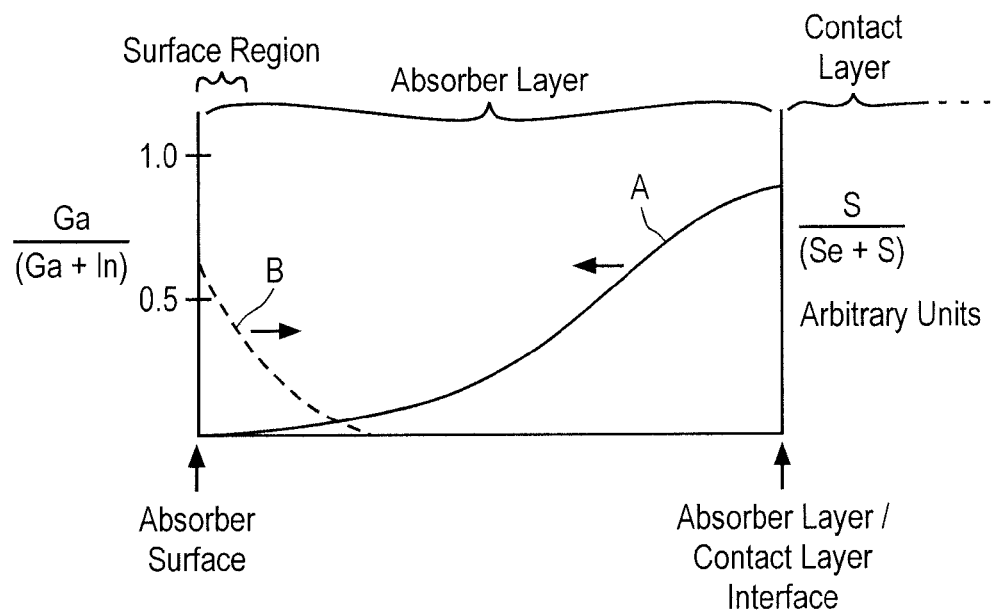
FIG. 2 is graph showing the Ga/(Ga+In) molar ratio (Curve A) in a typical prior art CIGS absorber layer grown by selenization of a metallic precursor including Cu, In and Ga, wherein when CIGS layer is sulfidized at high temperature, a S profile (Curve B) is obtained at the surface region increasing the bandgap value at that location.

As pointed out earlier, reaction of Cu, In and Se to form $CuInSe_2$ may start at around 300 C, and therefore this reaction is favorable compared to the reaction of Ga species which takes place at higher temperatures typically above 500 C. In other words if a metallic precursor layer containing Cu, In, and Ga is reacted with Se by increasing the temperature from room temperature to 550 C at a slow rate, as the precursor is heated up to around 300 C and beyond, Cu and In within the metallic precursor would start forming $CuInSe_2$ because both Cu and In would easily diffuse to the surface and react with Se. As an example, let us assume that a heating rate of 5 C/sec is employed during a reaction process. This means that it would take (550-300)/5=50 seconds for the temperature of the precursor to go from 300 C to 550 C. During this long period a large percentage of the In within the metallic precursor is expected to react with Cu and Se to form a surface layer which is rich in In such as shown in FIG. 2. This would be true even if the precursor layer comprises a Ga-rich or pure Ga surface, such as a Cu/In/Ga precursor stack deposited in that order over a base including a substrate and a contact layer.

Since reaction of Ga species takes place at higher temperatures (typically higher than 500 C), it is important to increase the rate of temperature rise, especially beyond 300 C. Use of a temperature rise rate of 10 C/sec would reduce the reaction time before the formation of Ga-rich phase to about 25 seconds. For the special precursor structure of the present invention this may be adequate since Ga is confined or sandwiched between two Group VIA-rich layers (the second portion 32B and the fourth portion 32D), however, the temperature rise rate for temperatures in the range of 300-600 C is preferably higher than 20 C/sec, more preferably higher than 30 C/sec, most preferably higher than about 5° C./sec. For a rate of 50 C/sec, the temperature of the precursor is expected to go from 300 C to 550 C in 5 seconds. This would help the Ga species reaction kinetics to catch up with that of In species since the temperature goes above 500 C in 4 seconds and Ga species can also start reacting along with In species. The special structure of the precursor layer 32 of the present invention also increases the residence time of Ga species near the surface and helps provide an absorber layer with increased Ga content at its surface.

Figure 4:
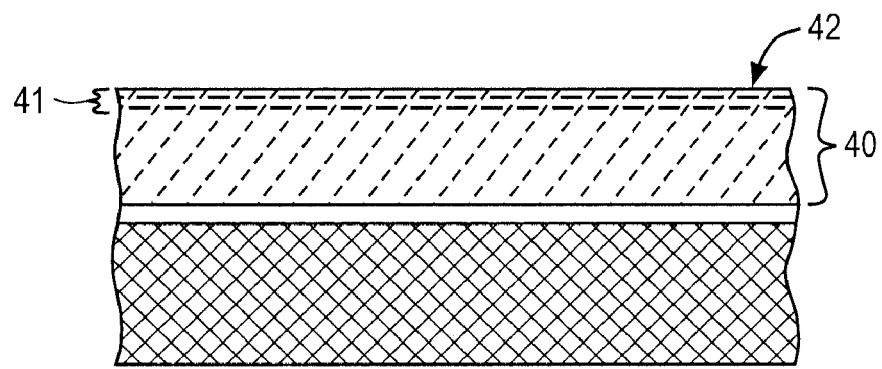
FIG. 4 is a compound CIGS absorber layer formed using the precursor layer depicted in FIG. 3.

FIG. 4 shows an exemplary CIGS absorber layer 40 formed by heating the structure 35 of FIG. 3 to a temperature above 500 C in an inert atmosphere or in an atmosphere containing Se. The heating rate for the temperature range between 300 C and the highest temperature (which may be in the 550-600 C range) is preferably higher than 20 C/sec, more preferably higher than 30 C/sec, most preferably higher than 50 C/sec. As can be seen from this figure the CIGS absorber layer 40 comprises a surface region 41, wherein the surface region 41 comprises a Ga/(Ga+In) ratio in the range of 0.1-0.3. The thickness of the surface region 41 is in the range of 0.1-0.5 um, preferably in the range of 0.1-0.3 um, whereas the total thickness of the CIGS absorber layer 40 may be 0.8-3.0 um, preferably 1-2 um. Below the surface region 41, the Ga/(Ga+In) ratio within the bulk of the absorber layer 40 depends on the composition of the first 32A of the precursor layer 32. Depending upon the Ga content of the first portion 32A, (Ga+In) ratio within the bulk of the absorber may change between 0 and 0.8, preferably between 0.1 and 0.6.

Solar cells may be fabricated on the CIGS absorber layer 40 of the present invention using materials and methods well known in the field. For example a thin (<0.1 microns) buffer layer such as a CdS layer may be deposited on the surface 42 of the absorber layer 40 using techniques such as the chemical bath deposition (CBD) method. A transparent window of a transparent conductive oxide (TCO) such as ZnO may be deposited over the CdS layer using MOCVD or sputtering techniques. A metallic finger pattern is optionally deposited over the TCO layer to complete the solar cell.

Although the present invention is described with respect to certain preferred embodiments, modifications thereto will be apparent to those skilled in the art.

What is claimed is:

1. A process of forming a Group IBIIIAVIA solar cell absorber on a base, comprising:
   forming a film on the base, wherein the film is substantially metallic and comprises Cu and In;
   forming a separator layer over the film, wherein the separator layer substantially comprises a Group VIA material;
   forming a source layer over the separator layer, wherein the source layer substantially comprises Ga and it is substantially metallic;
   forming a cap layer over the source layer, wherein the cap layer substantially comprises Se; and
   reacting the film, the separator layer, the source layer and the cap layer with each other at a reaction temperature to form the Group IBIIIAVIA absorber layer, the absorber layer including a surface region of less than or equal to 300 nm thickness, wherein the Ga/(Ga+In) molar ratio within the surface region is in the range of 0.1-0.3.

2. The process of claim 1, wherein the reaction temperature is in the range of 500-600° C.

3. The process of claim 2, wherein the film, the separator layer, the source layer and the cap layer are distinct layers with no substantial intermixing, and the step of reacting includes rapidly heating the film, the separator layer, the source layer and the cap layer to the reaction temperature with a heating rate of at least 50° C. per second.

4. The process of claim 3, wherein the thickness of the film is in the range of 500-1000 nm, the thickness of the separator layer is in the range of 100-1000 nm, the thickness of the source layer is in the range of 20-100 nm and the thickness of the cap layer is in the range of 800-3000 nm.

5. The process of claim 2, wherein the film further includes Ga.

6. The process of claim 5, wherein the film is in the form of a material stack made of distinct layers and the step of forming the film comprises:
   depositing a Cu layer over the base; and
   depositing at least two additional layers including Ga and In over the Cu layer, wherein the Ga/(Ga+In) ratio within the film is in the range of 0-0.7.

7. The process of claim 6, wherein the steps of depositing the Cu layer and depositing at least two additional layers are carried out by electroplating.

8. The process of claim 7, wherein the step of forming the separator layer comprises electroplating.

9. The process of claim 8, wherein the step of forming the source layer comprises vapor deposition.

10. The process of claim 9, wherein the step of forming the cap layer comprises vapor deposition.

11. The process of claim 5, wherein the film further includes Ga and further includes an additive material, wherein a ratio of the molar amount of In to the total molar amounts of In, Ga, Cu, and the additive material is in the range of 0.25-0.6.

12. The process of claim 11, wherein the additive material includes at least one dopant material selected from the group of Na, K and Li.

13. The process of claim 12, wherein the molar ratio of Cu/(In+Ga) in the film is in the range of 0.8-1.0.

14. The process of claim 2, wherein the separator layer further includes a first additive material, wherein a ratio of the molar amount of the Group VIA material to the total molar amounts of the Group VIA material and the first additive material is in the range of 0.95-below 1.0.

15. The process of claim 14, wherein the Group VIA material includes at least one of Se and Te, and the first additive material includes at least one of Cu, In, Ga and a dopant material selected from the group of Na, K and Li.

16. The process of claim 14, wherein the source layer further includes a second additive material, wherein a ratio of the molar amount of Ga to the total molar amounts of Ga and the second additive material is in the range of 0.7-below 1.0.

17. The process of claim 16, wherein the second additive material includes at least one of Cu, In, and a dopant material selected from the group of Na, K and Li.

18. The process of claim 16, wherein the cap layer further includes a third additive material, wherein a ratio of the molar amount of Se to the total molar amounts of Se and the third additive material is in the range of 0.95-below 1.0.

19. The process of claim 18, wherein the third additive material includes at least one of Te and a dopant material selected from the group of Na, K and Li.

20. The process of claim 2, wherein at least one of the separator layer, the source layer and the cap layer includes a dopant film comprising one of Na, K and Li.

21. The process of claim 20, wherein the thickness of the dopant film is in the range of 5-20 nm.

22. The process of claim 2, wherein the thickness of the film is in the range of 500-1000 nm, the thickness of the separator layer is in the range of 100-1000 nm, the thickness of the source layer is in the range of 20-100 nm and the thickness of the cap layer is in the range of 800-3000 nm.

23. The process of claim 1, wherein the step of forming the separator layer comprises electroplating.

24. The process of claim 1 wherein the Group VIA material is Se, wherein the source layer that substantially comprise Ga does not include at least one of Cu and In, and wherein during the reacting the Ga in the source layer disposed between the Se in the separator layer and the Se in the cap layer react together in what becomes a part of the surface region due to the Ga in the source layer being disposed between the Se in the separator layer and the Se in the cap layer.

25. The process of claim 4 wherein the Group VIA material is Se, wherein the source layer that substantially comprise Ga does not include at least one of Cu and In, and wherein during the reacting the Ga in the source layer disposed between the Se in the separator layer and the Se in the cap layer react together in what becomes a part of the surface region due to the Ga in the source layer being disposed between the Se in the separator layer and the Se in the cap layer.

26. The process of claim 22 wherein the Group VIA material is Se, wherein the source layer that substantially comprise Ga does not include at least one of Cu and In, and wherein during the reacting the Ga in the source layer disposed between the Se in the separator layer and the Se in the cap layer react together in what becomes a part of the surface region due to the Ga in the source layer being disposed between the Se in the separator layer and the Se in the cap layer.

* * * * *